United States Patent
Zhang et al.

(10) Patent No.: US 9,229,033 B2
(45) Date of Patent: Jan. 5, 2016

(54) VOLTAGE DETECTING SYSTEM

(71) Applicant: ShenZhen Treasure City Technology Co., LTD., ShenZhen (CN)

(72) Inventors: Peng Zhang, Wuhan (CN); Yu-Lin Liu, Wuhan (CN)

(73) Assignee: ShenZhen Treasure City Technology Co., LTD., ShenZhen (CN)

(*) Notice: Subject to any disclaimer, the term of this patent is extended or adjusted under 35 U.S.C. 154(b) by 168 days.

(21) Appl. No.: 14/085,210

(22) Filed: Nov. 20, 2013

(65) Prior Publication Data
US 2014/0285351 A1    Sep. 25, 2014

(30) Foreign Application Priority Data
Mar. 20, 2013    (CN) .......................... 2013 1 0089803

(51) Int. Cl.
G08B 3/00 (2006.01)
G01R 19/00 (2006.01)
G01R 15/09 (2006.01)

(52) U.S. Cl.
CPC ............ G01R 19/0084 (2013.01); G01R 15/09 (2013.01)

(58) Field of Classification Search
CPC .................. G08B 5/36; H02M 11/00
USPC .......................................... 340/691.1; 327/74
See application file for complete search history.

(56) References Cited

U.S. PATENT DOCUMENTS

| 6,225,992 B1 * | 5/2001 | Hsu | ...................... | G09G 3/3696 327/544 |
| 8,710,747 B2 * | 4/2014 | Hsu | ...................... | G01R 19/165 315/161 |

\* cited by examiner

*Primary Examiner* — Eric Blount
(74) *Attorney, Agent, or Firm* — Novak Druce Connolly Bove + Quigg LLP

(57) ABSTRACT

A voltage detecting system is configured for detecting a voltage supplied to an electronic device. The voltage detecting system includes a voltage measuring circuit configured to measure the voltage, a voltage converting circuit electrically coupled to the voltage, and a voltage comparing circuit. The voltage measuring circuit has a first measuring range and a second measuring range that is wider than the first measuring range. The voltage converting circuit is capable of the converting the voltage to an output voltage according to a predetermined ratio. The voltage comparing circuit compares the output voltage with a reference voltage. If the output voltage is greater than the reference voltage, the voltage comparing circuit informs the voltage measuring circuit to select the second measuring range. If the output voltage is not greater than the reference voltage, the voltage comparing circuit informs the voltage measuring circuit to select the first measuring range.

19 Claims, 2 Drawing Sheets

VOLTAGE DETECTING SYSTEM

BACKGROUND

1. Technical Field

The present disclosure relates to a voltage detecting system.

2. Description of Related Art

A voltage detecting circuit includes a voltage meter for detecting a voltage supplied to an electronic device. A voltage measuring range of the voltage meter needs to be adjusted since the voltage supplied to the electronic device may be less or greater than a predetermined voltage value. However, the voltage measuring range of the voltage detecting circuit cannot be adjusted automatically.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean "at least one."

Figure 1:
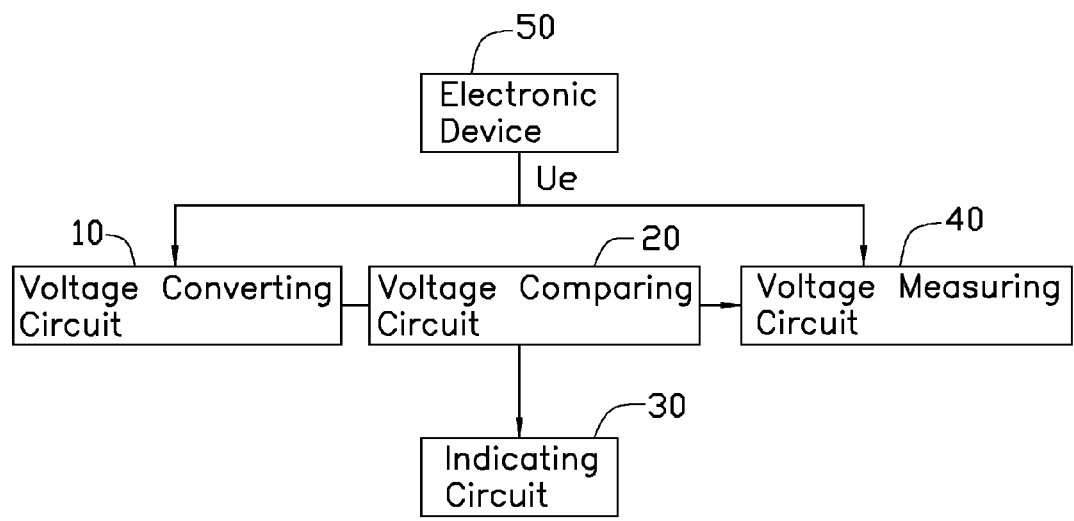
FIG. 1 is a block diagram of an embodiment of a voltage detecting system.
Figure 2:
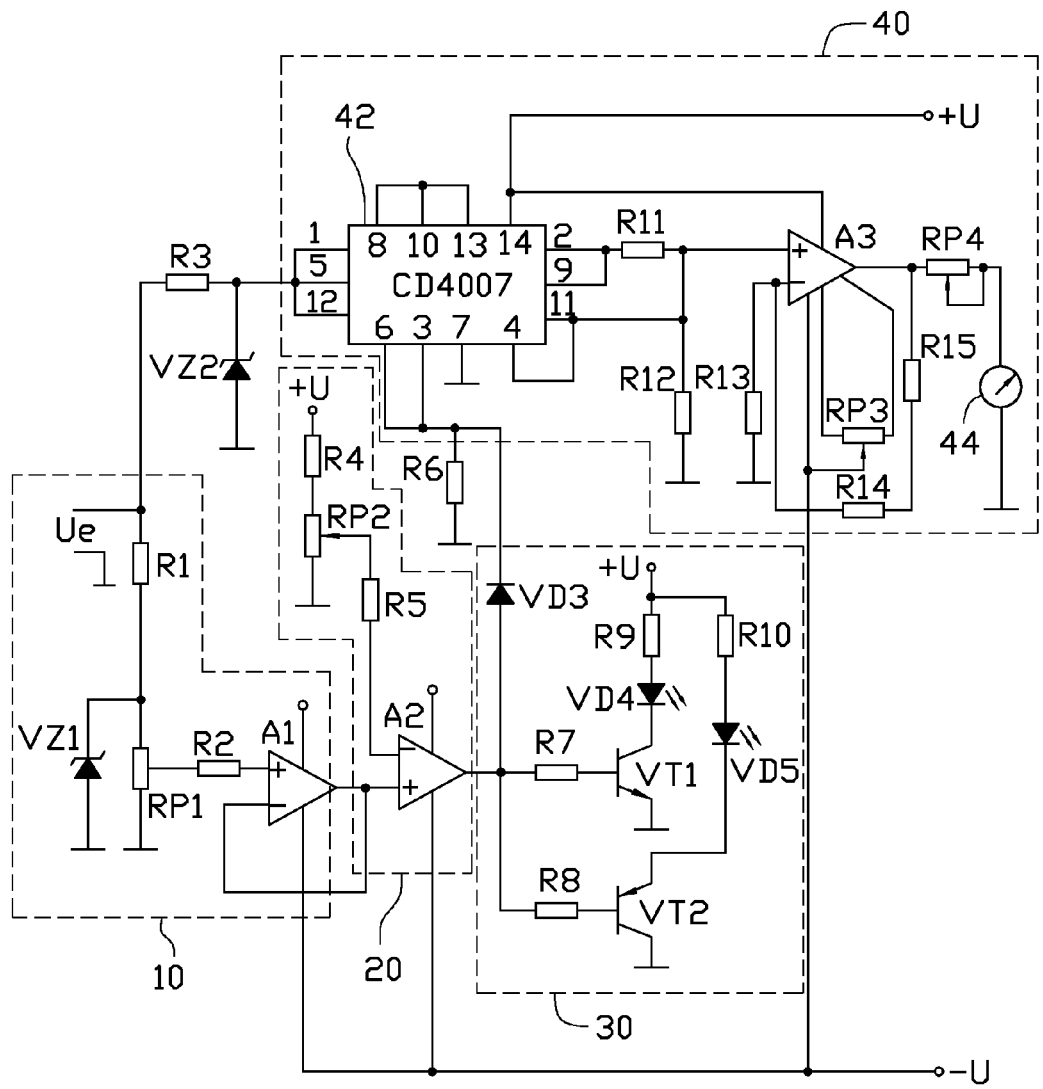
FIG. 2 is a detailed circuit of the voltage detecting system of FIG. 1.

FIGS. 1 and 2 show an embodiment of a voltage detecting system, which includes a voltage converting circuit 10, a voltage comparing circuit 20, an indicating circuit 30, and a voltage measuring circuit 40. The voltage detecting system is configured to detect a voltage Ue of an electronic device 50. In one embodiment, the electronic device 50 is a vending machine which includes a monitor, a compressor, a condenser, and a heater. The voltage Ue is a working voltage supplied to the monitor, the compressor, the condenser, or the heater.

The voltage converting circuit 10 includes a resistor R1, a first potentiometer RP1, a resistor R2, a first amplifier A1, and a zener diode VZ1. The first potentiometer RP1 includes a first terminal, a second terminal, and a sliding terminal movable between the first terminal and the second terminal. One terminal of the first resistor R1 is electrically coupled to the voltage Ue. The other terminal of the first resistor R1 is connected to the first terminal of the potentiometer RP1. The second terminal of the potentiometer RP1 is connected to ground. A negative terminal of the zener diode VZ1 is connected to the first terminal of the potentiometer RP1. A positive terminal of the zener diode VZ1 is connected to ground. One terminal of the resistor R2 is connected to the sliding terminal of the first potentiometer RP1. The other terminal of the resistor R2 is connected to a positive input terminal of the first amplifier A1. A negative input terminal of the first amplifier A1 is connected to an output terminal of the first amplifier A1. In one embodiment, a resistance of the resistor R1 is 100 KΩ. A maximum resistance of the first potentiometer RP1 is 10 KΩ. A resistance of the resistor R2 is 10 KΩ. The voltage Ue is divided by the first resistor R1, the first potentiometer RP1, and the resistor R2, thereby generating a divided voltage supplied to the positive input terminal of the first amplifier A1. The first amplifier A1 outputs the divided voltage to the voltage comparing circuit 20. The divided voltage is adjustable while moving the sliding terminal of the first potentiometer RP1.

The voltage comparing circuit 20 includes a resistor R4, a second potentiometer RP2, a resistor R5, and a second amplifier A2. The second potentiometer RP2 includes a first terminal, a second terminal, and a sliding terminal movable between the first terminal and the second terminal. One terminal of the resistor R4 is electrically coupled to a voltage +U. The other terminal of the resistor R4 is connected to the first terminal of the second potentiometer RP2. The second terminal of the potentiometer RP2 is connected to ground. One terminal of the resistor R5 is connected to the sliding terminal of the second potentiometer RP2. The other terminal of the resistor R5 is connected to a negative input terminal of the second amplifier A2. A positive input terminal of the second amplifier A2 is connected to the output terminal of the first amplifier A1. An output terminal of the second amplifier A2 is connected to the indicating circuit 30 and the voltage measuring circuit 40. The voltage +U is divided by the resistor R4, the second potentiometer RP2, and the resistor R5. A reference voltage is generated and supplied to the negative input terminal of the second amplifier A2. The reference voltage is adjustable by moving the sliding terminal of the second potentiometer RP2. The second amplifier A2 compares the divided voltage output from the voltage converting circuit 10 with the reference voltage. If the divided voltage output from the voltage converting circuit 10 is greater than the reference voltage, the second amplifier A2 outputs a first output signal which is at high level. If the divided voltage output from the voltage converting circuit 10 is not greater than the reference voltage, the second amplifier A2 outputs a second output signal which is at low level.

The indicating circuit 30 includes resistors R7-R10, a first transistor VT1, a second transistor VT2, a first LED VD4, and a second LED VD5. One terminal of the resistor R7 is connected to the output terminal of the second amplifier A2. The other terminal of the resistor R7 is connected to a base terminal of the first transistor VT1. One terminal of the resistor R8 is connected to the output terminal of the second amplifier A2. The other terminal of the resistor R8 is connected to a base terminal of the second transistor VT2. A positive terminal of the first LED VD4 is coupled to the voltage +U via the resistor R9. A negative terminal of the first LED VD4 is connected to a collector terminal of the first transistor VT1. An emitter terminal of the first transistor Q1 is connected to ground. A positive terminal of the second LED VD5 is coupled to the voltage +U via the resistor R10. A negative terminal of the second LED VD5 is connected to an emitter terminal of the second transistor VT2. A collector terminal of the second transistor VT2 is connected to ground. In one embodiment, the first transistor VT1 is an NPN-type bipolar transistor. The second transistor VT2 is a PNP-type bipolar transistor.

When the comparing circuit 20 outputs the first output signal which is at high level, the first transistor VT1 is switched on, and the second transistor is switched off. The first LED VD4 is powered on and emits light. The second LED VD5 is powered off.

When the comparing circuit 20 outputs the second output signal which is at low level, the first transistor VT1 is switched off, and the second transistor is switched on. The first LED VD4 is powered off. The second LED VD5 is powered on and emits light.

The voltage measuring circuit 40 includes a measuring range selecting chip 42, a third amplifier A3, and an indicating meter 44. In one embodiment, the measuring range selecting chip 42 is a CD4007 chip. Pins 1, 5, and 12 of the measuring range selecting chip 42 are coupled to the voltage Ue via a resistor R3. A negative terminal of a second zener diode VZ2 is connected to the pins 1, 5, and 12 of the measuring range selecting chip 42. A positive terminal of the second zener diode VZ2 is connected to ground. Pins 3 and 6 of the measuring range selecting chip 42 are connected to the output terminal of the voltage comparing circuit 20 via a diode VD3. One terminal of a resistor R6 is connected to the pins 3 and 6 of the measuring range selecting chip 42. The other terminal of the resistor R6 is connected to ground. Pins 8, 10, and 13 of the measuring range selecting chip 42 are connected to each other. A pin 7 of the measuring range selecting chip 42 is connected to ground. A pin 14 of the measuring range selecting chip 42 is coupled to the voltage +U. Pins 4 and 11 are connected to a positive input terminal of the third amplifier A3. One terminal of a resistor R12 is connected to the positive input terminal of the third amplifier A3. The other terminal of the resistor R12 is connected to ground. One terminal of a resistor R11 is connected to pins 2 and 9. The other terminal of the resistor R11 is connected to the positive input terminal of the third amplifier A3. A third potentiometer RP3 is connected to the third amplifier A3 for adjusting an output voltage of the third amplifier A3. A fourth potentiometer RP4 is connected between an output terminal of the third amplifier A3 and the indicating meter 44 for adjusting a pointer of the indicating meter 44.

When the voltage detecting system works, the voltage converting circuit 10 converts the voltage Ue to an output voltage according to a predetermined ratio. The voltage comparing circuit 20 compares the output voltage output from the voltage converting circuit 10 with the reference voltage supplied to the negative input terminal of the second amplifier A2. When the output voltage is greater than the reference voltage, the voltage comparing circuit 20 outputs the first output signal, which is at high level to the measuring range selecting chip 42 and the indicating circuit 30. The first LED VD4 is powered on and emits light. The second LED VD5 is powered off. The measuring range selecting chip 42 selects a first voltage range (e.g., 0~300V) for the voltage measuring circuit 40. The measuring range selecting chip 42 outputs a voltage signal to the third amplifier A3. The third amplifier A3 amplifies the voltage signal and sends the amplified voltage signal to the indicating meter 44. The pointer of the indicating meter 44 is driven by the amplified voltage signal. The indicating meter 44 displays a voltage value of the voltage Ue.

When the output voltage is not greater than the reference voltage, the voltage comparing circuit 20 outputs the second output signal which is at low level to the measuring range selecting chip 42 and the indicating circuit 30. The first LED VD4 is powered off. The second LED VD5 is powered on and emits light. The measuring range selecting chip 42 selects a second voltage range (e.g., 0~100V) for the voltage measuring circuit 40.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A voltage detecting system for detecting a voltage supplied to an electronic device, comprising:
   a voltage measuring circuit configured to measure the voltage and having a first measuring range and a second measuring range that is wider than the first measuring range;
   a voltage converting circuit electrically coupled to the voltage and capable of the converting the voltage to an output voltage according to a predetermined ratio; and
   a voltage comparing circuit connected to the voltage measuring circuit and the voltage converting circuit and configured to compare the output voltage output from the voltage converting circuit with a reference voltage;
   wherein if the output voltage is greater than the reference voltage, the voltage comparing circuit informs the voltage measuring circuit to select the second measuring range; and if the output voltage is not greater than the reference voltage, the voltage comparing circuit informs the voltage measuring circuit to select the first measuring range.

2. The voltage detecting system of claim 1, further comprising an indicating circuit connected to the voltage comparing circuit for indicating whether the output voltage is greater than the reference voltage.

3. The voltage detecting system of claim 1, wherein the voltage measuring circuit comprises a measuring range selecting chip and an indicating meter connected to the measuring range selecting chip, the measuring range selecting chip is configured to select the first measuring range or the second measuring range according to a comparing result output from the voltage comparing circuit, and the indicating meter is configured to indicating a voltage value of the voltage supplied to the electronic device.

4. The voltage detecting system of claim 3, wherein the voltage measuring circuit further comprises an amplifier connected between the measuring range selecting chip and the indicating meter, and the amplifier is configured to amplify a voltage signal output from the measuring range selecting chip and send an amplified voltage signal to the indicating circuit.

5. The voltage detecting system of claim 4, wherein a potentiometer is connected between an output terminal of the amplifier and the indicating meter, and the potentiometer is configured to adjust an initial position of a pointer of the indicating meter.

6. The voltage detecting system of claim 2, wherein the voltage converting circuit includes a first resistor, a first potentiometer, a second resistor, and a first amplifier; the first potentiometer comprises a first terminal, a second terminal, and a sliding terminal movable between the first terminal and the second terminal; a first terminal of the first resistor is electrically coupled to the voltage, a second terminal of the first resistor is connected to the first terminal of the first potentiometer, a second terminal of the first potentiometer is connected to ground; a first terminal of the second resistor is connected to the sliding terminal of the first potentiometer, and a second terminal of the second resistor is connected to a positive input terminal of the first amplifier; and a negative input terminal of the first amplifier of the amplifier is connected to an output terminal of the first amplifier.

7. The voltage detecting system of claim 6, wherein a resistance of the second resistor is equal to a maximum resistance of the first potentiometer, and a resistance of the first resistance is greater than the resistance of the second resistor.

8. The voltage detecting system of claim 7, wherein the voltage comparing circuit includes a fourth resistor, a second potentiometer, a fifth resistor, and a second amplifier; the second potentiometer comprises a first terminal, a second terminal, and a sliding terminal movable between the first terminal and the second terminal; a first terminal of the fourth resistor is electrically coupled to a power source, a second terminal of the fourth resistor is connected to the first terminal of the second potentiometer; a second terminal of the second potentiometer is connected to ground; a first terminal of the fifth resistor is connected to the sliding terminal of the second potentiometer, and a second terminal of the fifth resistor is connected to a negative input terminal of the second amplifier, a positive input terminal of the second amplifier is connected to the output terminal of the first amplifier, and an output terminal of the second amplifier is connected to the indicating circuit and the voltage measuring circuit.

9. The voltage detecting system of claim 8, wherein the indicating circuit comprises a ninth resistor, a tenth resistor, a first LED, a second LED, a first transistor, and a second transistor; a base terminal of the first transistor is connected to the output terminal of the second amplifier, a collector terminal of the first transistor is connected to a negative terminal of the first LED, a positive terminal of the first LED is coupled to the power source via the fifth resistor, and an emitting terminal of the first transistor is connected to ground; a base terminal of the second transistor is connected to the output terminal of the second amplifier, an emitter terminal of the second transistor is connected to a negative terminal of the second LED, a positive terminal of the second LED is coupled to the power source via the tenth resistor, and a collector terminal of the second transistor is connected to ground.

10. The voltage detecting system of claim 9, wherein the first transistor is an NPN-type bipolar transistor, and the second transistor is a PNP-type bipolar transistor.

11. A voltage detecting system for detecting a voltage supplied to an electronic device, comprising:
a voltage measuring circuit configured to measure the voltage and having a first measuring range and a second measuring range that is wider than the first measuring range;
a voltage converting circuit electrically coupled to the voltage and capable of the converting the voltage to an output voltage according to a predetermined ratio;
a voltage comparing circuit connected to the voltage measuring circuit and the voltage converting circuit, and configured to compare the output voltage output from the voltage converting circuit with a reference voltage;
an indicating circuit connected to the voltage comparing circuit for indicating whether the output voltage is greater than the reference voltage
wherein if the output voltage is greater than the reference voltage, the voltage comparing circuit informs the voltage measuring circuit to select the second measuring range; and if the output voltage is not greater than the reference voltage, the voltage comparing circuit informs the voltage measuring circuit to select the first measuring range.

12. The voltage detecting system of claim 11, wherein the voltage measuring circuit comprises a measuring range selecting chip and an indicating meter connected to the measuring range selecting chip, the measuring range selecting chip is configured to select the first measuring range or the second measuring range according to a comparing result output from the voltage comparing circuit, and the indicating meter is configured to indicating a voltage value of the voltage supplied to the electronic device.

13. The voltage detecting system of claim 12, wherein the voltage measuring circuit further comprises an amplifier connected between the measuring range selecting chip and the indicating meter, and the amplifier is configured to amplify a voltage signal output from the measuring range selecting chip and send an amplified voltage signal to the indicating circuit.

14. The voltage detecting system of claim 13, wherein a potentiometer is connected between an output terminal of the amplifier and the indicating meter, and the potentiometer is configured to adjust an initial position of a pointer of the indicating meter.

15. The voltage detecting system of claim 11, wherein the voltage converting circuit includes a first resistor, a first potentiometer, a second resistor, and a first amplifier; the first potentiometer comprises a first terminal, a second terminal, and a sliding terminal movable between the first terminal and the second terminal; a first terminal of the first resistor is electrically coupled to the voltage, a second terminal of the first resistor is connected to the first terminal of the first potentiometer, a second terminal of the first potentiometer is connected to ground; a first terminal of the second resistor is connected to the sliding terminal of the first potentiometer, and a second terminal of the second resistor is connected to a positive input terminal of the first amplifier; and a negative input terminal of the first amplifier of the amplifier is connected to an output terminal of the first amplifier.

16. The voltage detecting system of claim 15, wherein a resistance of the second resistor is equal to a maximum resistance of the first potentiometer, and a resistance of the first resistance is greater than the resistance of the second resistor.

17. The voltage detecting system of claim 16, wherein the voltage comparing circuit includes a fourth resistor, a second potentiometer, a fifth resistor, and a second amplifier; the second potentiometer comprises a first terminal, a second terminal, and a sliding terminal movable between the first terminal and the second terminal; a first terminal of the fourth resistor is electrically coupled to a power source, a second terminal of the fourth resistor is connected to the first terminal of the second potentiometer; a second terminal of the second potentiometer is connected to ground; a first terminal of the fifth resistor is connected to the sliding terminal of the second potentiometer, and a second terminal of the fifth resistor is connected to a negative input terminal of the second amplifier, a positive input terminal of the second amplifier is connected to the output terminal of the first amplifier, and an output terminal of the second amplifier is connected to the indicating circuit and the voltage measuring circuit.

18. The voltage detecting system of claim 17, wherein the indicating circuit comprises a ninth resistor, a tenth resistor, a first LED, a second LED, a first transistor, and a second transistor; a base terminal of the first transistor is connected to the output terminal of the second amplifier, a collector terminal of the first transistor is connected to a negative terminal of the first LED, a positive terminal of the first LED is coupled to the power source via the fifth resistor, and an emitting terminal of the first transistor is connected to ground; a base terminal of the second transistor is connected to the output terminal of the second amplifier, an emitter terminal of the second transistor is connected to a negative terminal of the second LED, a positive terminal of the second LED is coupled to the power source via the tenth resistor, and a collector terminal of the second transistor is connected to ground.

19. The voltage detecting system of claim 18, wherein the first transistor is an NPN-type bipolar transistor, and the second transistor is a PNP-type bipolar transistor.

* * * * *